United States Patent
Teichmann et al.

(10) Patent No.: US 10,693,248 B2
(45) Date of Patent: Jun. 23, 2020

(54) METHOD FOR ELECTRICALLY CONNECTING AN ELECTRONIC MODULE AND ELECTRONIC ASSEMBLY

(71) Applicant: Infineon Technologies AG, Neubiberg (DE)

(72) Inventors: Katharina Teichmann, Munich (DE); Alexander Herbrandt, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/981,647

(22) Filed: May 16, 2018

(65) Prior Publication Data

US 2018/0337475 A1    Nov. 22, 2018

(30) Foreign Application Priority Data

May 17, 2017   (EP) .................................... 17171551

(51) Int. Cl.
*H01R 12/58*   (2011.01)
*H05K 1/14*    (2006.01)
(Continued)

(52) U.S. Cl.
CPC .......... *H01R 12/585* (2013.01); *H01B 1/026* (2013.01); *H01R 4/58* (2013.01); *H01R 12/52* (2013.01);
(Continued)

(58) Field of Classification Search
CPC ........ H01R 12/585; H01R 4/58; H01R 12/52; H01R 13/03; H01B 1/026; H05K 5/0069; H05K 1/144; H05K 2201/10856; H05K 2201/042; H05K 2201/10303; H05K 2201/10318; H05K 2201/1059; H05K 1/0306

See application file for complete search history.

(56) References Cited

U.S. PATENT DOCUMENTS 4,762,498 A    8/1988   Harting et al.
7,494,389 B1   2/2009   Essert et al.
(Continued)

FOREIGN PATENT DOCUMENTS

WO    2015165914 A1    11/2015

OTHER PUBLICATIONS

Mattsson, Joakim et al., "Press-Fit Technology", Tyco Electronics AMP GmbH, TE Connectivity, TE Automotive, White Paper, accessed online May 16, 2018 at http://www.te.com/content/dam/te-com/documents/automotive/global/whitepaper-pressfit-072014,pdf.
"CuMg 018665 Copper Magnesium Alloy", https://www.kme.com/fileadmin/DOWNLOADCENTER/COPPER%20DIVISON/4%20Industrial%20 Rolled/4_Alloys/STOL_R_78_pdf, Aug. 15, 2015, pp. 1-5.

*Primary Examiner* — Hoa C Nguyen
(74) *Attorney, Agent, or Firm* — Murphy, Bilak & Homiller, PLLC

(57) ABSTRACT

An electronic assembly has an electronic module and an electric part. The electronic module has an electric terminal having a press-fit section. The press-fit section includes at least one of the following CuFeP; CuZr; CuCrZr; CuMg; CuCrTiSi; CuCrAgFeTiSi; and CuNiSiMg. The electric part has a contact hole. The electronic assembly includes a press-fit connection between the press-fit section and the electric part. In that press-fit connection, the press-fit section both mechanically and electrically contacts the electric part.

21 Claims, 4 Drawing Sheets

(51) Int. Cl.
   *H01B 1/02* (2006.01)
   *H01R 4/58* (2006.01)
   *H01R 12/52* (2011.01)
   *H05K 5/00* (2006.01)
   H01R 13/03 (2006.01)
   H05K 1/03 (2006.01)

(52) U.S. Cl.
   CPC ........... *H05K 1/144* (2013.01); *H05K 5/0069* (2013.01); *H01R 13/03* (2013.01); *H05K 1/0306* (2013.01); *H05K 2201/042* (2013.01); *H05K 2201/1059* (2013.01); *H05K 2201/10303* (2013.01); *H05K 2201/10318* (2013.01); *H05K 2201/10856* (2013.01)

(56) References Cited

U.S. PATENT DOCUMENTS

| | | | |
|---|---|---|---|
| 2005/0090155 A1 | 4/2005 | Blossfeld | |
| 2009/0010797 A1* | 1/2009 | Aruga | C22C 9/00 420/472 |
| 2011/0111641 A1* | 5/2011 | Nakazawa | H01R 12/58 439/660 |
| 2011/0256749 A1* | 10/2011 | Bayerer | H01R 12/585 439/345 |
| 2016/0336245 A1* | 11/2016 | Egusa | H01R 12/585 |
| 2017/0054235 A1* | 2/2017 | Pola | H01R 12/52 |
| 2017/0085016 A1* | 3/2017 | Sasayama | H01R 12/585 |

* cited by examiner

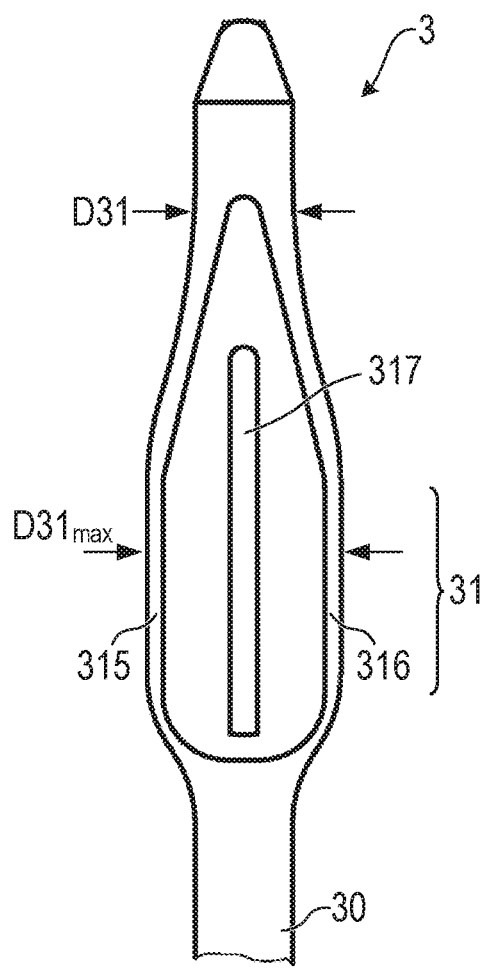
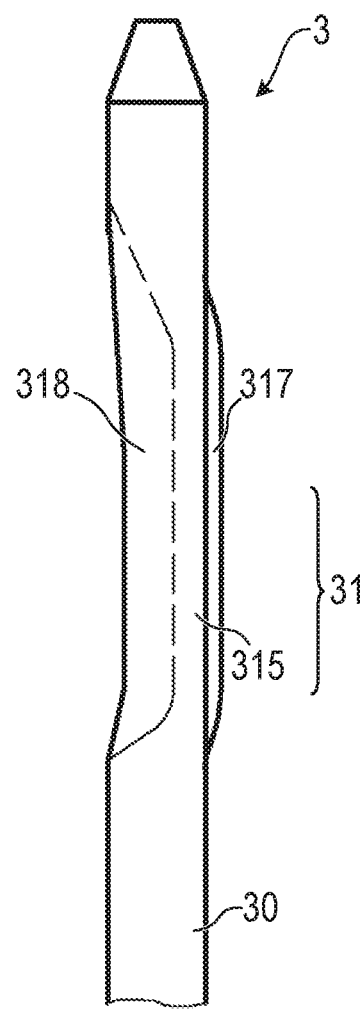
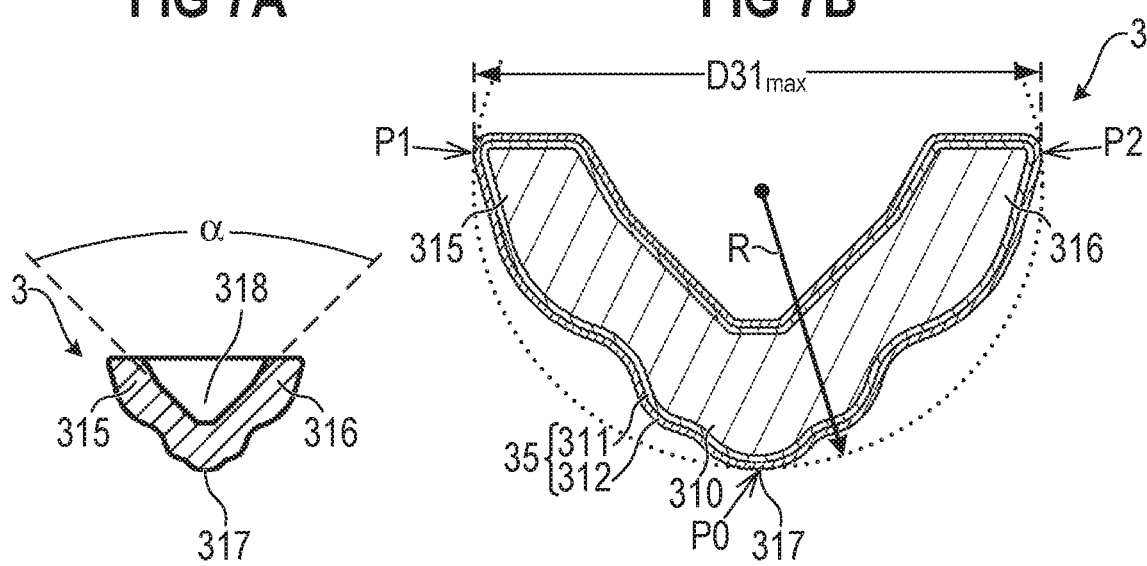
FIG 7A   FIG 7B   FIG 7C   FIG 8

METHOD FOR ELECTRICALLY CONNECTING AN ELECTRONIC MODULE AND ELECTRONIC ASSEMBLY

TECHNICAL FIELD

The instant disclosure relates to a method for electrically connecting an electronic module and to an electronic assembly.

BACKGROUND

Electric press-fit-connections, in which electric press-fit-terminals are pressed into corresponding electric contact holes, are widely used in electronics for electrically connecting two electric parts, e.g. an electronic module and a circuit board. When high currents flow across a press-fit-terminal, ohmic losses can cause high temperatures (e.g. about 200° C.) of the terminal and the adjacent regions of the electric parts. In addition to the related loss of energy, high temperatures at an electric press-fit-terminal can cause a deterioration of the terminal and the connected electric parts. In order to keep the ohmic losses and the related high temperatures low, press-fit-terminals are often made of low-ohmic materials. However, many low-ohmic materials have a low mechanical strength so that pressing a low-ohmic press-fit-terminal into a corresponding contact hole can cause an undesired deformation of the terminal. If the press-fit-terminal does not precisely fit in the corresponding contact opening, the press-fit-terminal may even be bent in an unintentional manner so that it cannot be pressed into the contact opening. A further problem that may occur with a press-fit-connection is that the electric contact resistance may increase over time.

Hence, a need has been identified for a method for electrically connecting an electronic module and an electric part using a low-ohmic press-fit-terminal that has a high mechanical strength and that allows for the formation of a press-fit-connection having a long lasting low transition resistance. A further need has been identified for an electronic module assembly in which an electric part is reliably electrically connected to an electronic module.

SUMMARY

In a method, an electronic module having an electric terminal and an electric part having a contact hole are provided. The electric terminal has a press-fit section that includes one of the following alloys: CuFeP; CuZr; CuCrZr; CuMg; CuCrTiSi; CuCrAgFeTiSi; CuNiSiMg. The press-fit section is pressed into the contact hole so that the press-fit section is plastically deformed, and both mechanically and electrically contacts the electric part.

An electronic assembly includes an electronic module and an electric part. The electronic module has an electric terminal having a press-fit section. The press-fit section includes at least one of the following alloys: CuFeP; CuZr; CuCrZr; CuMg; CuCrTiSi; CuCrAgFeTiSi; CuNiSiMg. The electric part has a contact hole. The electronic assembly includes a press-fit connection between the press-fit section and the electric part. In that press-fit connection, the press-fit section both mechanically and electrically contacts the electric part.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

FIGS. 7A to 7C illustrate different views of a press-fit section of a press-fit terminal.

FIG. 8 is an enlarged view of FIG. 7C.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. As well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element".

Figure 1:
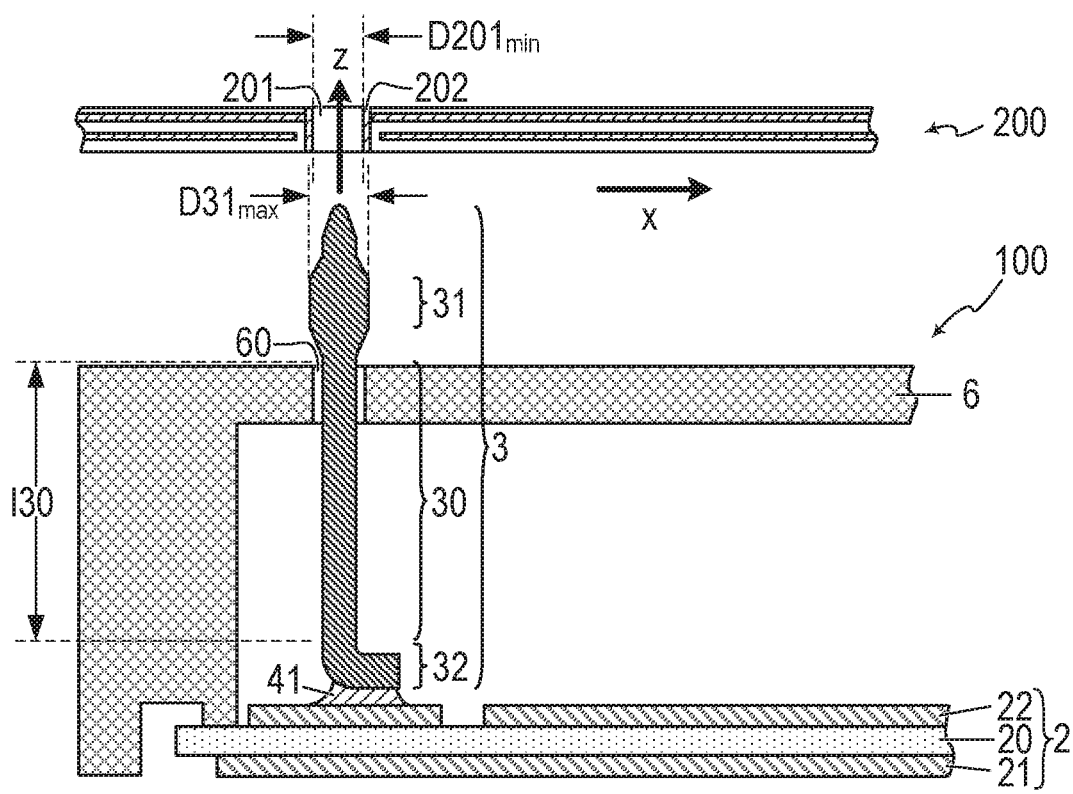
FIG. 1 is a cross-sectional side view of a section of an electronic module having a press-fit-terminal to be pressed into a contact opening of a circuit board.
Figure 2:
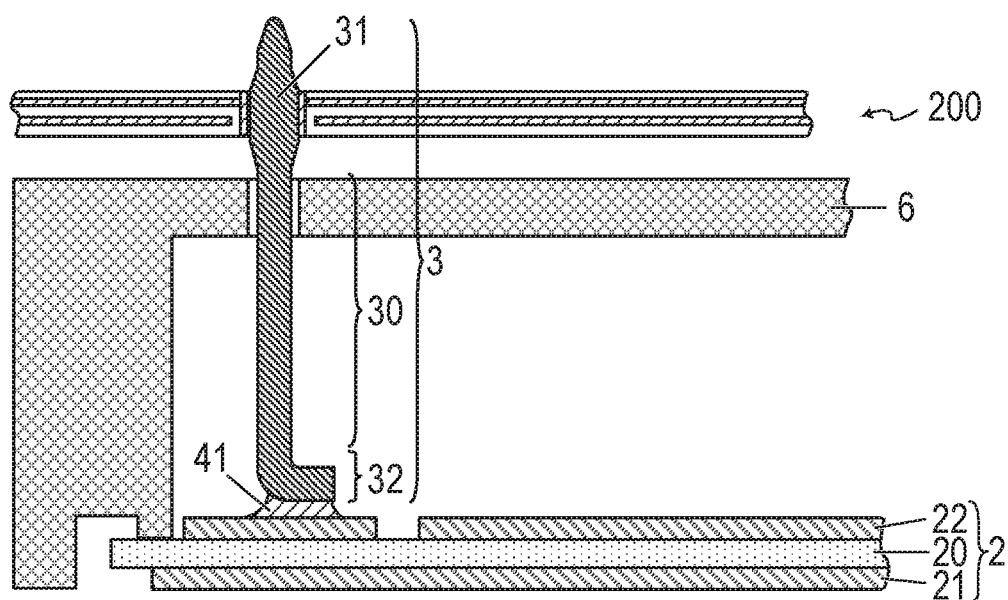
FIG. 2 is a cross-sectional side view of a section of an electronic module assembly in which the electronic module and the circuit board of FIG. 1 have been electrically connected by pressing the press-fit-terminal into the contact opening.

Referring to FIG. 1, an exemplary electronic module 100 includes an electrically conductive press-fit terminal 3 having a press-fit section 31, a module connection section 32, and an optional shaft 30 electrically and mechanically connecting the press-fit section 31 and the module connection section 32. The press-fit terminal 3 serves to electrically connect the electronic module 100 to an electric part 200 external to the electronic module 100. In the present example, the electric part 200 is, without being restricted to, a circuit board, e.g. a printed circuit board (PCB). In any case, the electric part 200 includes a contact hole 201 which may be a through hole (as shown), or, alternatively, a blind hole (not shown). In order to electrically connect the electronic module 100 and the electric part 200, the press-fit terminal 3 is, with its press-fit section 31, pressed into the contact hole 201. Thereby, the press-fit section 31 is plastically deformed and, at the contact hole 201, comes into electrical and physical contact with the electric part 200, e.g. with a surface metallization 202 of the contact hole 201. FIG. 2 shows the result with the press-fit section 31 pressed into the contact hole 201.

The plastic deformation is caused by an oversize of the press-fit section 31 relative to the contact hole 201 prior to pressing it into the contact hole 201. Prior to pressing the press-fit section 31 into the contact hole 201, the press-fit section 31 has a maximum lateral dimension $D31_{max}$ greater than a minimum lateral width $D201_{min}$ (to be measured in the same lateral direction x as the maximum lateral dimension $D31_{max}$, of the contact hole 201. For instance, a ratio $D31_{max} \div D201_{min}$ between $D31_{max}$ and $D201_{min}$ (to be measured, relative to the pressing direction z, in the same lateral direction x) may be in, without being restricted to, greater than 1 and less than or equal to 1.3, e.g. at least 1.05 and less than or equal to 1.3. If, for instance, the contact hole 201 has a circular cross-section, the minimum lateral width $D201_{min}$ is the minimum diameter of the contact hole 201. In this sense, a lateral dimension or width (and, therefore, a minimum or maximum lateral dimension) is to be determined perpendicularly to the pressing direction z of a force with which the press-fit section 31 is pressed into the contact hole 201.

The press-fit terminal 3 (or at least its press-fit section 31) includes or consists of one of the following alloys: CuFeP; CuZr; CuCrZr; CuMg; CuCrTiSi; CuCrAgFeTiSi; CuNiSiMg. The designations of these alloys are abbreviated and, in the sense of the present description and the claims, to be understood as follows (in each case, R designates one or more alloying constituents not explicitly mentioned in the respective alloy):

CuFeP means $Cu_aFe_bP_cR_d$ with
a≥96.82 weight %;
b=2.1 to 2.6 weight %;
c=0.015 to 0.15 weight %;
d=0 to 0.43 weight %;
a+b+c+d=100 weight %.

CuZr means $Cu_aZr_bR_c$ with
a≥99.7 weight %;
b=0.1 to 0.2 eight %;
c=0 to 0.1 weight %;
a+b+c=100 weight %.

CuCrZr means $Cu_aCr_bZr_cR_d$ with
a≥98.32 weight %;
b=0.5 to 1.2 weight %;
c=0.03 to 0.3 weight %;
d=0 to 0.18 weight %;
a+b+c+d=100 weight %.

CuMg means $Cu_aMg_bR_c$ with
a≥98.6 weight %;
b=0.08 to 0.8 weight %;
c=0 to 0.6 weight %;
a+b+c=100 weight %.

CuCrTiSi means $Cu_aCr_bTi_cSi_dR_e$ with
a≥99.0 weight %;
b=0.15 to 0.4 weight %;
c=0.1 to 0.4 weight %;
d=0.02 to 0.07 weight %;
e=0 to 0.82 weight %;
a+b+c+d+e=100 weight %.

$Cu_aCr_bAg_cFe_dTi_eSi_fR_g$ with
a≥98.73 weight %;
b=0.2 to 0.7 weight %;
c=0.01 to 0.3 weight %;
d=0.02 to 0.2 weight %;
e=0.01 to 0.15 weight %;
f=0.01 to 0.1 weight %;
g=0 to 0.2 weight %;
a+b+c+d+e+g=100 weight %.

CuNiSiMg means $Cu_aNi_bSi_cMg_dR_e$ with
a≥93.25 weight %;
b=2.2 to 4.2 weight %;
c=0.25 to 1.2 weight %;
d=0.05 to 0.3 weight %;
e=0 to 3.75 weight %;
a+b+c+d+e=100 weight %.

The alloys mentioned above are shown to have low electrical resistivities, good thermal conductivities, and mechanical strengths low enough as to allow for the mentioned plastic deformation but high enough as to prevent the press-fit terminal 3 from being undesirably deformed during the press-fit process. After the press-fit section 31 has been pressed into the contact hole 201 and thereby plastically deformed, the plastically deformed press-fit section 31 still has a remaining elasticity sufficient to ensure a long lasting low electrical transition resistance between the press-fit terminal 3 and the metallization 202 of the contact hole 201. The mentioned alloys allow for a reduction of the temperatures of the press-fit terminal 3 and the electric part 200, and an increased power density of the electronic module 100. In an experiment, geometrically identical press-fit terminals made of different alloys were investigated with respect to the temperatures of the terminals resulting from different currents through the respective terminal. For instance, many circuit boards that may be used as circuit board 200 have a maximum rated temperature of 105° C. In order to prevent the temperature of a conventional terminal (made of CuSn4) from exceeding 105° C., the current through the terminal had to be limited to 32 A. Whereas for CuMg and CuCrZr (i.e. materials used in connection with the present description) the current had to be limited to 48 A (CuMg) and 58 A (CuCrZr). That is, compared to conventional CuSn4, the ampacity could be increased by a factor of about 1.5 or 1.8.

As illustrated in FIGS. 1 and 2, the electronic module 100 may have a module housing 6. The module housing 6 may be dielectric (e.g. consist of or include a thermosetting or thermoplastic material) in order to provide for a good electric insulation. However, the module housing 6 may be electrically conductive. If the electronic module includes a module housing 6, the press-fit terminal 3 may be routed through a passage opening 60 of the module housing 6 so that the press-fit section 31 is disposed outside the module housing 6 and that the module connection section 32 is disposed inside the module housing 6. As illustrated in the present example, the module housing 6 may have a lid section that runs substantially parallel to the substrate 2, and the press-fit terminal 3 may be routed through a passage opening 60 formed in the lid section. However, the lid section may be omitted. In any case, the press-fit section 31 is accessible from outside the electronic module 100.

Optionally, the electronic module 100 may include a circuit carrier 2, e.g. a ceramic substrate as illustrated. The circuit carrier 2 includes a dielectric layer 20 (which is, in case of a ceramic substrate 2, a ceramic layer), a first substrate metallization layer 21 and an optional second substrate metallization layer 22. The first substrate metallization layer 21 is attached to a first surface of the dielectric layer 20, and the second substrate metallization layer 22 (if provided) is attached to a second surface of the dielectric layer 20 opposite the first surface. As illustrated, the first substrate metallization layer 21 may be patterned to include at least two conductor tracks disposed distant from one another so that an electronic circuit can be realized by mounting and electrically interconnecting electronic components on the circuit carrier 2. That is, the circuit carrier 2 may be an electronic circuit board. According to a further option that is also illustrated in FIGS. 1 and 2, the press-fit section 31 may be disposed at that side of the electronic module 100 that is opposite the circuit carrier 2.

A dielectric ceramic layer 20 may be made of any dielectric ceramic material, e.g. alumina ($Al_2O_3$), aluminum nitride (AlN) or silicon nitride ($Si_3N_4$), so that it can provide for an electrical insulation between the first substrate metallization layer 21 and the second substrate metallization layer 22. If it is desired that the ceramic layer 20 electrically insulates the first substrate metallization layer 21 from the second substrate metallization layer 22, it may be free of electrically conductive vias. Alternatively, however, the ceramic layer 20 of a ceramic substrate 2 may include one or more electrically conductive vias electrically connecting the first substrate metallization layer 21 and the second substrate metallization layer 22.

The first substrate metallization layer 21 and the second substrate metallization layer 22 may include any metal or alloy, e.g. copper, a copper alloy, aluminum, or an aluminum alloy, and be attached to opposite surfaces of the ceramic layer 20 using any joining technique, e.g. brazing, direct copper bonding (DCB) or direct aluminum bonding (DAB).

As also illustrated in FIGS. 1 and 2, the press-fit terminal 3 is, at its module connection section 32, electrically connected to a further element of the electronic module 100. In the example of FIGS. 1 and 2, the press-fit terminal 3 is electrically connected to the first substrate metallization layer 21 using an electrically conductive first joining layer 41 that adjoins both the first substrate metallization layer 21 and the module connection section 32. For instance, the first joining layer 41 may be a solder layer, a layer including a sintered metal (e.g. silver) powder, or a layer of an electrically conductive adhesive.

Figure 3:
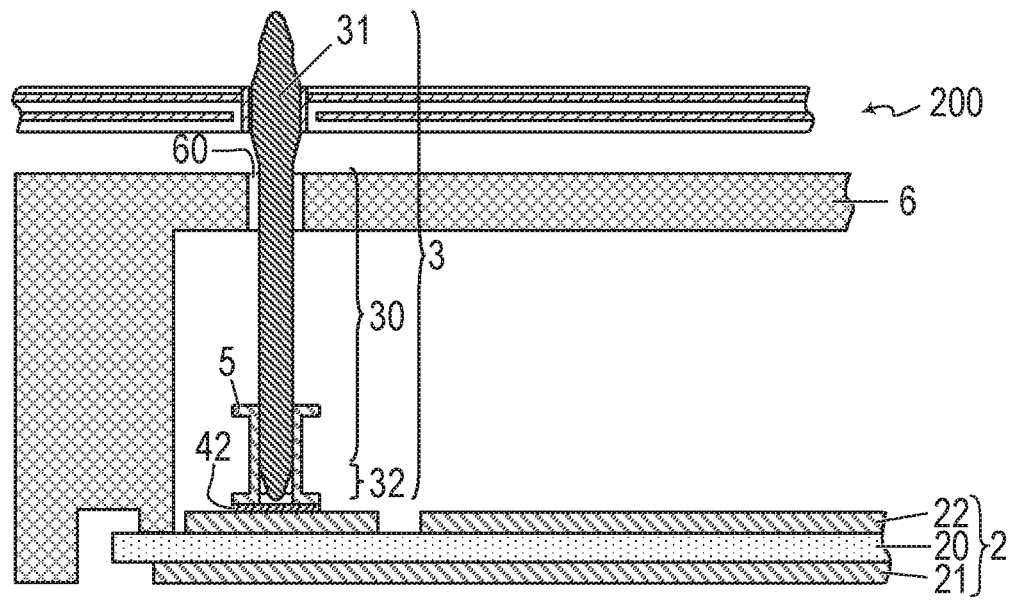
FIG. 3 is a cross-sectional side view of a section of an electronic module assembly in which a press-fit-terminal is plugged in a sleeve mounted on a circuit carrier of the electronic module.
Figure 4:
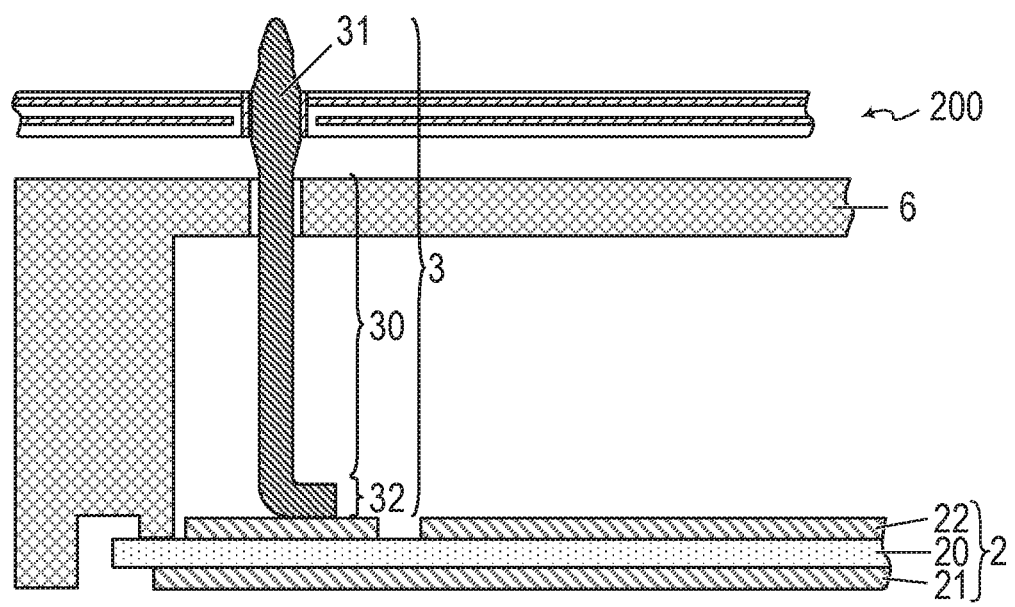
FIG. 4 is a cross-sectional side view of a section of an electronic module assembly in which a press-fit-terminal has been electrically connected to a circuit carrier of the electronic module by ultrasonic welding or resistance welding.

Alternatives for electrically connecting the press-fit terminal 3 at its module connection section 32 to a further element of the electronic module 100 are illustrated in FIGS. 3 and 4.

According to the example of FIG. 3, an electrically conductive sleeve 5 may be mounted on and electrically connected to the first substrate metallization layer 21 using an electrically conductive second joining layer 42 that adjoins both the first substrate metallization layer 21 and the sleeve 5. For instance, the second joining layer 42 may be a solder layer, a layer including a sintered metal (e.g. silver) powder, or a layer of an electrically conductive adhesive. At its module connection section 32, the press-fit terminal 3 is pressed into the sleeve 5 so that the module connection section 32 electrically and mechanically contacts the sleeve 5.

Figure 5:
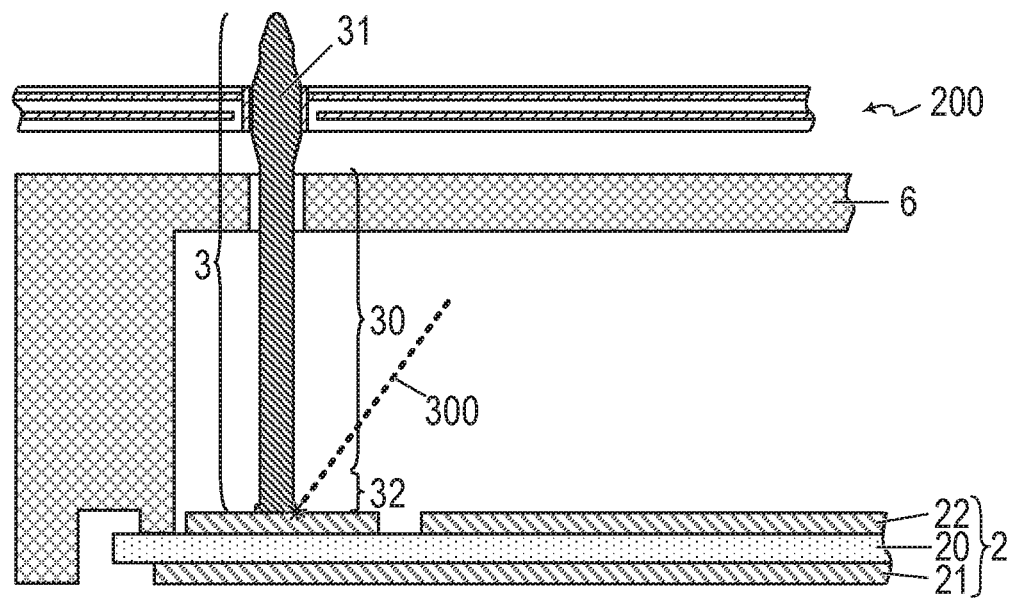
FIG. 5 is a cross-sectional side view of a section of an electronic module assembly in which a press-fit-terminal is electrically connected to a circuit carrier of the electronic module by laser welding.

According to the examples of FIGS. 4 and 5, the module connection section 32 of the press-fit terminal 3 may be directly connected to the first substrate metallization layer 21 by welding, e.g. by ultrasonic or resistance welding (FIG. 4), or by laser welding using a laser beam 300 (FIG. 5). In FIG. 5, the laser beam 300 is illustrated in dashed fashion in order to illustrate that the welding process took place prior to pressing the press-fit terminal 3 into the contact hole 201.

Instead of electrically connecting the press-fit terminal 3 at its module connection section 32 to the first substrate metallization layer 21, the same techniques may be used to electrically connect the press-fit terminal 3 at its module connection section 32 to any other electrical element of the electronic module 100, e.g. to a terminal metallization layer of a semiconductor chip that is disposed inside the module housing 6 and mounted on the circuit carrier 2.

Irrespective of the type of electrical connection between the press-fit terminal 3 and the first substrate metallization layer 21, the connection may be formed prior to or after attaching the module housing 6 to the substrate 2.

Figure 6:
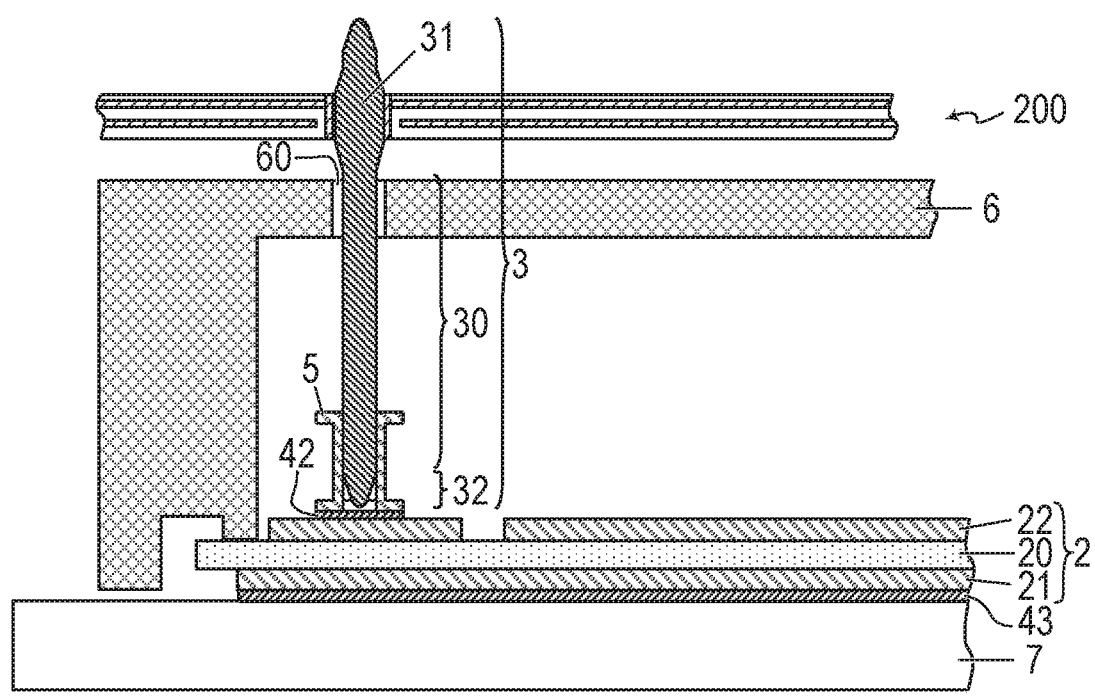
FIG. 6 is a cross-sectional side view of a section of an electronic module assembly which differs from the electronic module assembly of FIG. 2 in that the electronic module includes a baseplate.

According to a further option illustrated in FIG. 6, the electronic module 100 may include a rigid base plate 7, and a third joining layer 43 that joins the circuit carrier 2 (e.g. the second substrate metallization layer 22) and the base plate 7 and adjoins both of them. For instance, the third joining layer 43 may be a solder layer, a layer including a sintered metal (e.g. silver) powder, or a layer of an electrically conductive or electrically insulating adhesive. The base plate 7 mechanically stabilizes the circuit carrier 2. For instance, the base plate 7, which may have a thickness of at least 2 mm, may be made of metal, or of a metal matrix composite (MMC) material (e.g. AlSiC). Even though the example of FIG. 6 is based on the example of FIG. 3, any other electronic module 100 may include such a base plate 7 that is joined to the circuit carrier 2 using a third joining layer 43 as described.

The press-fit terminal 3 may electrically and mechanically be connected at its module connection section 32 to the further element (in the illustrated examples, the further element is the first substrate metallization layer 21) of the electronic module 100 prior to pressing its press-fit section 31 into the contact hole 201. The press-fit terminal 3 may be pre-fabricated so that, after it has been connected at its module connection section 32 to the further element, no material needs to be removed from the press-fit terminal 3. According to one option, the press-fit terminal 3 may be pre-fabricated to its final shape so that, after it has been connected at its module connection section 32 to the further element, no reshaping (e.g. bending, embossing) of the press-fit terminal 3 is required. According to a different option, the press-fit terminal 3 may be pre-fabricated and, after it has been connected at its module connection section 32 to the further element, reshaped (e.g. by bending and/or embossing).

Producing a pre-fabricated press-fit terminal 3 may be carried out by stamping a sheet section out of a sheet metal, and, (if desired) subsequently reshaping the sheet section (e.g. by bending and/or embossing). As an alternative, a pre-fabricated press-fit terminal 3 may be produced by cutting a wire section from a metal wire (e.g. produced by wire drawing) and, (if desired) subsequently reshaping the wire section (e.g. by bending and/or embossing).

The press-fit terminal 3 or at least its shaft 30 was found to have an ideal tensile strength in the range from 520 MPa to 720 MPa (at 23° C.; according to DIN EN ISO 6892-1: 2017-02). For a particular alloy, the tensile strength may, to a certain extent, be adapted to a desired tensile strength by employing one or more forming processes, e.g. by rolling, extruding, and/or by annealing. If the tensile strength is significantly lower than 52.0 MPa there is a risk that the press-fit terminal 3 will be distorted in an undesired manner, and if the tensile strength significantly exceeds 720 MPa, there is a risk that the contact hole 201 will be damaged.

According to another option, the press-fit terminal 3 or at least its shaft 30 may have an elongation at break in the range from 2% to 8% (at 23° C.; according to DIN EN ISO 6892-1:2017-02). For a particular alloy, the elongation at break may, to a certain extent, be adapted to a desired tensile strength by employing one or more forming processes, e.g. by rolling, extruding, and/or by annealing. If the elongation at break is lower than 2%, there is a risk that the press-fit terminal 3 will crack when it is pressed into the contact hole 201, and if the elongation at break exceeds 8%, the press-fit terminal 3 is comparatively soft so that there is no sufficient contact pressure with which the press-fit section 31 is pressed against the metallization 201.

If the press-fit terminal 3 has a shaft 30, the shaft 30 may optionally be straight. For instance, the shaft 30 may be longish and have, in a cross-sectional plane perpendicular to its longitudinal direction, a substantially rectangular or square cross-section, i.e. the cross-section may be a rectangle or square having rounded edges. The length 130 of the shaft 30 may be in, without being restricted to, a range from 5 mm to 20 mm.

A press-fit terminal as described herein may even be used in connection with a small contact hole 201, e.g. a contact hole 201 having a width or diameter D201 of less than or equal to 1.09 mm, e.g. for a contact hole 201 having a width or diameter D201 of at least 0.9 mm and of less than or equal to 0.9 mm, e.g. of at least 0.94 mm and of less than or equal to 1.09 mm. However, it is to be noted that a width or diameter D201 of less than 0.9 mm or of more than 1.09 mm may also be used.

FIG. 7A illustrates a side view of a press-fit section 31 that may be used in connection with any of the examples explained above. FIG. 7B shows a further side view, and FIG. 7C shows a cross-section taken in a direction perpendicular to the direction z of a force with which the press-fit section 31 is pressed into the contact hole 201 (i.e. the pressing direction z). This direction may be identical to the longitudinal direction of the shaft 30 (if provided). As can be seen from FIGS. 7A to 7C, the press-fit section 31 may have two legs (a first leg 315 and a second leg 316), a protrusion 317, and, opposite the protrusion 317, a recess 318. In FIG. 7B, the recess 318 is hidden behind the first leg 315 and, therefore, illustrated in dashed fashion. FIG. 8 is an enlarged view of FIG. 7C.

In the cross-sectional plane of FIGS. 7C and 8, the legs 315 and 316 enclose an angle α different from 0° and different from 180° and therefore form spring. For instance, the angle α may be in, without being restricted to, a range from 85° to 95°. When inserting the press-fit section 31 into the contact hole 201, the press-fit section 31 is plastically deformed but remains, to a certain extent, elastic. The remaining elasticity is, inter alia, caused by the spring formed by the legs 315 and 316. That is, when inserting the press-fit section 31 into the contact hole 201, the spring formed by the legs 315 and 316 is elastically pre-tensioned so that the legs 315 and 316 and the protrusion 317 are pressed against and electrically contact the metallization 202.

As illustrated in FIG. 8, the press-fit section 31 may have, perpendicularly to the pressing direction z, a largest circumcircle. A or the largest circumcircle is a or the circumcircle among all circumcircles of the press-fit section 31 perpendicularly to the pressing direction z having the largest diameter. In FIG. 8, a section of a maximum circumcircle is indicated by a dotted line having a radius $R_{max}$ (which may also be referred to as maximum circumcircle radius) and a diameter $D31_{max} \times = 2 \cdot R_{max}$ (the diameter $D31_{max}$ may also be referred to as maximum circumcircle diameter). Optionally, a maximum circumcircle may include a point P0 on the surface of the protrusion 317, a point P1 on the surface of the first leg 315, and a point P2 on the surface of the second leg 316. A ratio $D31_{max} \div D201_{min}$ may be in, without being restricted to, a range from 1.05 to 1.3.

According to a further option also illustrated in FIG. 8, the press-fit terminal 3 or at least its press-fit section 31 may have a core region 310, and an electrically conductive surface coating 35 formed on the core region 310. Such a surface coating 35 may serve to prevent a surface oxidation of the press-fit terminal 3 or at least of the press-fit section 31, and/or facilitate the formation of cold-welding connection between the metallization 202 and the press-fit section 31 after the press-fit section 31 has been pressed into the contact hole 201. A surface coating 35 may include at least one coating layer. In the present example, the surface coating 35 includes a first coating layer 311 and a second coating layer 312. The first coating layer 311 consists of or includes nickel (Ni; layer thickness e.g. 1 μm to 2 μm), and the second coating layer 312 consists of or includes tin (Sn; layer thickness e.g. 0.5 μm to 2 μm). The first coating layer 311 is disposed between and adjoins both the core region 310 and the second coating layer 312. If the press-fit terminal 3 or at least its press-fit section 31 has a surface coating 35, the surface coating 35 makes contact with the metallization 202 of the contact hole 201 when the press-fit section 31 is pressed into the contact hole 201. The first coating layer 311 is disposed between and adjoins both the core region 310 and the second coating layer 312. Alternatively or additionally to a first coating layer 311 consisting of or including nickel (Ni) and a second coating layer 312 consisting of or including tin (Sn), a surface coating 35 may include at least one coating layer that includes or consists of a noble metal, e.g. gold (Au) or palladium (Pd). A suitable layer thickness of a surface coating is, without being restricted to, from 1.5 μm to 4 μm. The core region 310 may consist of or include one of the alloys (CuFeP; CuZr; CuCrZr; CuMg; CuCrTiSi; CuCrAgFeTiSi; CuNiSiMg) mentioned above. A suitable method for applying the surface coating 35 to the core region 310 is, e.g., galvanic plating. However, it is to be noted that the surface coating 35 may be omitted so that the press-fit terminal 3 consists of the core region 310 consisting of or including one of the alloys (CuFeP; CuZr; CuCrZr; CuMg; CuCrTiSi; CuCrAgFeTiSi; CuNiSiMg) mentioned above.

In the previous examples, the electric part 200 has been described as a circuit board. However, the electric part 200 may also be a metal plate or a metal bar, a further electronic module (e.g. an inverter module, a capacitor module, a control unit for controlling the electronic module 100, etc.), or any other electronic unit.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc, and are also not intended to be limiting. Like terms refer to like elements throughout the description.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. An electronic assembly, comprising:
    an electronic module comprising an electric terminal, the electric terminal including a press-fit section that comprises at least one of the following alloys: CuFeP; CuZr; CuCrZr; CuMg; CuCrTiSi; CuCrAgFeTiSi; and CuNiSiMg;

an electric part comprising a contact hole; and
a press-fit connection between the press-fit section and the electric part in which the press-fit section is plastically deformed and both mechanically and electrically contacts the electric part.

2. The electronic assembly of claim 1, wherein the contact hole has a minimum diameter of at least 0.9 mm and of less than or equal to 1.1 mm.

3. The electronic assembly of claim 1, wherein the electric terminal or at least the press-fit section comprises:
a core region consisting of or comprising one of the following alloys: CuFeP; CuZr; CuCrZr; CuMg; CuCrTiSi; CuCrAgFeTiSi; and CuNiSiMg; and
at least in the press-fit section, a surface coating applied to the core region.

4. The electronic assembly of claim 3, wherein the surface coating comprises at least one of:
a first coating layer comprising nickel; and
a second coating layer comprising tin.

5. The electronic assembly of claim 1, wherein:
the electronic module comprises a substrate with a dielectric layer and a substrate metallization layer attached to the dielectric layer; and
the electric terminal comprises a module connection section which is
inserted in an electrically conductive sleeve mounted on and electrically connected to the substrate metallization layer; or
electrically and mechanically connected to the substrate metallization layer by a joining layer that adjoins both the module connection section and the substrate metallization layer; or
directly welded to the substrate metallization layer.

6. The electronic assembly of claim 1, wherein the electric part is or comprises a circuit board or a metal plate.

7. The electronic assembly of claim 1, wherein the electric terminal comprises a straight shaft having at least one of:
a tensile strength in a range from 520 MPa to 720 MPa;
an ultimate strain elongation at break in a range from 2% to 8%.

8. The electronic assembly of claim 1,
wherein CuFeP means $Cu_aFe_bP_cR_d$ with:
a≥96.82 weight %;
b=2.1 to 2.6 weight %;
c=0.015 to 0.15 weight %;
d=0 to 0.43 weight %;
a+b+c+d=100 weight %; and
R designates one or more additional alloying constituents,
wherein CuZr means $Cu_aZr_bR_c$ with:
a≥99.7 weight %;
b=0.1 to 0.2 weight %;
c=0 to 0.1 weight %;
a+b+c=100 weight %; and
R designates one or more additional alloying constituents,
wherein CuCrZr means $Cu_aCr_bZr_cR_d$ with:
a≥98.32 weight %;
b=0.5 to 1.2 weight %;
c=0.03 to 0.3 weight %;
d=0 to 0.18 weight %;
a+b+c+d=100 weight %; and
R designates one or more additional alloying constituents,
wherein CuMg means $Cu_aMg_bR_c$ with:
a≥98.6 weight %;
b=0.08 to 0.8 weight %;
c=0 to 0.6 weight %;
a+b+c=100 weight %; and
R designates one or more additional alloying constituents,
wherein CuCrTiSi means $Cu_aCr_bTi_cSi_dR_e$ with:
a≥99.0 weight %;
b=0.15 to 0.4 weight %;
c=0.1 to 0.4 weight %;
d=0.02 to 0.07 weight %;
e=0 to 0.82 weight %;
a+b+c+d+e=100 weight %; and
R designates one or more additional alloying constituents,
wherein $Cu_aCr_bAg_cFe_dTi_eSi_fR_g$ with:
a≥98.73 weight %;
b=0.2 to 0.7 weight %;
c=0.01 to 0.3 weight %;
d=0.02 to 0.2 weight %;
e=0.01 to 0.15 weight %;
f=0.01 to 0.1 weight %;
g=0 to 0.2 weight %;
a+b+c+d+e+f+g=100 weight %; and
R designates one or more additional alloying constituents,
wherein CuNiSiMg means $Cu_aNi_bSi_cMg_dR_e$ with:
a≥93.25 weight %;
b=2.2 to 4.2 weight %;
c=0.25 to 1.2 weight %;
d=0.05 to 0.3 weight %;
e=0 to 3.75 weight %;
a+b+c+d+e=100 weight %; and
R designates one or more additional alloying constituents.

9. The electronic assembly of claim 1, wherein the electronic module further comprises a substrate having a substrate metallization layer, wherein the electric terminal further comprises a module connection section electrically connected to the substrate metallization layer of the substrate, and wherein the module connection section and the press-fit section of the electric terminal comprise the same material.

10. The electronic assembly of claim 9, wherein the electronic module further comprises a housing, wherein the module connection section of the electric terminal is disposed inside the module housing, and wherein the press-fit section of the electric terminal is routed through a passage opening of the module housing so that the press-fit section is disposed outside the module housing.

11. A method, comprising:
providing an electronic module comprising an electric terminal, the electric terminal including a press-fit section that comprises one of the following alloys: CuFeP; CuZr; CuCrZr; CuMg; CuCrTiSi; CuCrAgFeTiSi; and CuNiSiMg;
providing an electric part comprising a contact hole; and
pressing the press-fit section into the contact hole so that the press-fit section is plastically deformed, and both mechanically and electrically contacts the electric part.

12. The method of claim 11, wherein:
the contact hole has, prior to pressing the press-fit section in a pressing direction into the contact hole, perpendicularly to the pressing direction, a minimum diameter;
the press-fit section has, prior to pressing the press-fit section into the contact hole, perpendicularly to the pressing direction, a maximum circumcircle diameter; and a ratio between the maximum circumcircle diameter and the minimum diameter is selected to be greater than 1 and less than or equal to 1.3.

13. The method of claim 11, wherein the contact hole has, prior to pressing the press-fit section into the contact hole, perpendicularly to the pressing direction, a minimum diameter of at least 0.9 mm and of less than or equal to 1.1 mm.

14. The method of claim 11, wherein the electric terminal or at least the press-fit section comprises:
  a core region comprising one of the following alloys: CuFeP; CuZr; CuCrZr; CuMg; CuCrTiSi; CuCrAgFeTiSi; CuNiSiMg; and
  at least in the press-fit section, a surface coating applied to the core region.

15. The method of claim 14, wherein the press-fit section comprises a first leg and a second leg enclosing an angle of at least 85° and of less than or equal to 95°.

16. The method of claim 11, wherein:
  the electronic module comprises a substrate with a dielectric layer and a substrate metallization layer attached to the dielectric layer; and
  the electric terminal comprises a module connection section at which it is electrically connected to the substrate metallization layer by one of:
    inserting the module connection section in an electrically conductive sleeve mounted on and electrically connected to the substrate metallization layer;
    electrically and mechanically connecting the module connection section to the substrate metallization layer using a joining layer that adjoins both the module connection section and the substrate metallization layer; or
    welding the module connection section to the substrate metallization layer.

17. The method of claim 11, wherein the electric part is or comprises a circuit board or a metal plate.

18. The method of claim 11, wherein the electric terminal comprises a straight shaft having at least one of:
  a tensile strength in a range from 520 MPa to 720 MPa;
  an ultimate strain elongation at break in a range from 2% to 8%.

19. The method of claim 11,
  wherein CuFeP means $Cu_a Fe_b P_c R_d$ with:
    $a \geq 96.82$ weight %;
    $b=2.1$ to 2.6 weight %;
    $c=0.015$ to 0.15 weight %;
    $d=0$ to 0.43 weight %;
    $a+b+c+d=100$ weight %; and
    R designates one or more additional alloying constituents,
  wherein CuZr means $Cu_a Zr_b R_c$ with:
    $a \geq 99.7$ weight %;
    $b=0.1$ to 0.2 weight %;
    $c=0$ to 0.1 weight %;
    $a+b+c=100$ weight %; and
    R designates one or more additional alloying constituents,
  wherein CuCrZr means $Cu_a Cr_b Zr_c R_d$ with:
    $a \geq 98.32$ weight %;
    $b=0.5$ to 1.2 weight %;
    $c=0.03$ to 0.3 weight %;
    $d=0$ to 0.18 weight %;
    $a+b+c+d=100$ weight %; and
    R designates one or more additional alloying constituents,
  wherein CuMg means $Cu_a Mg_b R_c$ with:
    $a \geq 98.6$ weight %;
    $b=0.08$ to 0.8 weight %;
    $c=0$ to 0.6 weight %;
    $a+b+c=100$ weight %; and
    R designates one or more additional alloying constituents,
  wherein CuCrTiSi means $Cu_a Cr_b Ti_c Si_d R_e$ with:
    $a \geq 99.0$ weight %;
    $b=0.15$ to 0.4 weight %;
    $c=0.1$ to 0.4 weight %;
    $d=0.02$ to 0.07 weight %;
    $e=0$ to 0.82 weight %;
    $a+b+c+d+e=100$ weight %; and
    R designates one or more additional alloying constituents,
  wherein $Cu_a Cr_b Ag_c Fe_d Ti_e Si_f R_g$ with:
    $a \geq 98.73$ weight %;
    $b=0.2$ to 0.7 weight %;
    $c=0.01$ to 0.3 weight %;
    $d=0.02$ to 0.2 weight %;
    $e=0.01$ to 0.15 weight %;
    $f=0.01$ to 0.1 weight %;
    $g=0$ to 0.2 weight %;
    $a+b+c+d+e+f+g=100$ weight %; and
    R designates one or more additional alloying constituents,
  wherein CuNiSiMg means $Cu_a Ni_b Si_c Mg_d R_e$ with:
    $a \geq 93.25$ weight %;
    $b=2.2$ to 4.2 weight %;
    $c=0.25$ to 1.2 weight %;
    $d=0.05$ to 0.3 weight %;
    $e=0$ to 3.75 weight %;
    $a+b+c+d+e=100$ weight %; and
    R designates one or more additional alloying constituents.

20. The method of claim 11, further comprising:
  electrically connecting a module connection section of the electric terminal to a substrate metallization layer of a substrate of the electronic module,
  wherein the module connection section and the press-fit section of the electric terminal comprise the same material.

21. The method of claim 20, wherein the module connection section of the electric terminal is disposed inside a module housing of the electronic module, and wherein the press-fit section of the electric terminal is routed through a passage opening of the module housing so that the press-fit section is disposed outside the module housing.

* * * * *

UNITED STATES PATENT AND TRADEMARK OFFICE
CERTIFICATE OF CORRECTION

PATENT NO. : 10,693,248 B2
APPLICATION NO. : 15/981647
DATED : June 23, 2020
INVENTOR(S) : Teichmann et al.

It is certified that error appears in the above-identified patent and that said Letters Patent is hereby corrected as shown below:

On the Title Page

Item (57), abstract (Line 4), please change "following" to -- following alloys: --.

Signed and Sealed this
First Day of September, 2020

Andrei Iancu
*Director of the United States Patent and Trademark Office*